United States Patent [19]
Thirumoorthy et al.

[11] Patent Number: 6,061,826
[45] Date of Patent: May 9, 2000

[54] HARDWARE-OPTIMIZED REED-SOLOMON DECODER FOR LARGE DATA BLOCKS

[75] Inventors: Hari Thirumoorthy, San Diego, Calif.; Karl R. Wittig, New York; Samir N. Hulyalkar, Ossining, both of N.Y.

[73] Assignee: Philips Electronics North America Corp., New York, N.Y.

[21] Appl. No.: 08/902,049

[22] Filed: Jul. 29, 1997

[51] Int. Cl.[7] .............................. H04L 5/22; H03M 13/00
[52] U.S. Cl. .................................... 714/784; 375/220
[58] Field of Search ............................. 375/220; 714/784

[56] References Cited

U.S. PATENT DOCUMENTS

| | | | |
|---|---|---|---|
| 5,517,509 | 5/1996 | Yoneda | 371/37.1 |
| 5,570,378 | 10/1996 | Inoue et al. | 714/757 |
| 5,691,994 | 11/1997 | Acosta et al. | 371/40.1 |
| 5,717,715 | 2/1998 | Claydon et al. | 375/220 |
| 5,878,058 | 2/1999 | Im | 714/784 |

*Primary Examiner*—William Grant
*Assistant Examiner*—Iván Calcano
*Attorney, Agent, or Firm*—Gregory L. Thorne

[57] ABSTRACT

An error computation processor for use in a Reed Solomon decoder for computing the error locations and magnitudes of a large data block having a maximum of t errors over a desired Galois field. The processor can compute the error-locator polynomial, the error-evaluator polynomial, and the values of the errors whose location was determined to be in error with only two polynomial storage registers, two element storage registers, one multiplier for performing selected multiplication and division, one adder for performing selected addition and subtraction, one error locator stack, one error value stack, and a syndrome register for storing the syndromes of the large data block.

20 Claims, 8 Drawing Sheets

HARDWARE-OPTIMIZED REED-SOLOMON DECODER FOR LARGE DATA BLOCKS

1. Field of the Invention

The present invention relates to Reed-Solomon decoders in general, and in particular, to an improved error computation processor for computing the error locations and magnitudes thereof in large data blocks.

1. Description of the Related Art

One of the principal methods of error detection and correction in digital data transmission and storage systems uses the class of error-correcting codes known as Reed-Solomon codes. Two such Reed-Solomon systems are described in chapter 6 of *Error Control Coding: Fundamentals and Applications,* by S. Lin and D. J. Costello, Jr. (Prentice-Hall, Inc., Englewood Cliffs, N.J. 1983) (hereinafter *"Error Control Coding"*) and in chapter 7 of *Theory and Practice of Error Control Codes* by R. E. Blahut (Addison-Wesley Publishing Co., Reading, Mass., 1983) (hereinafter *"Theory and Practice of Error Control Codes"*). The theory behind the encoding and decoding methods in the prior art systems is well-known to those of ordinary skill in the art, as are some decoding algorithms for detecting and correcting errors in the received or retrieved data. Generally speaking, the decoding process is more complicated than the encoding process.

One such application of known Reed-Solomon decoder is found in the transmission of digital compressed video over a terrestrial broadcast, cable, or satellite channel. For example, the Grand Alliance (GA) announced a standard for Digital HDTV transmission over such channels. The GA HDTV transmission system uses a specified (207, 187) Reed-Solomon (hereinafter also referred to as "R-S") code for forward error correction. In this code, 187 bytes of "payload" data and an additional 20 bytes of error-checking data make up a Reed-Solomon block of 207 bytes.

In the above example, approximately 10 percent of the R-S block consists of error-checking data; this is a relatively small percentage of the block data. In general, the larger the block size, the smaller the block percentage of error-checking data that is needed to meet a given performance requirement. Since the execution time of the decoding process depends only on the amount of error-checking data, a larger block size permits a smaller percentage of the block processing time to be used for error detection and correction at a given processing rate. Conversely, the processing may be performed at a slower rate. This in turn allows a trade-off of processing speed in exchange for simpler, more economical hardware which may be more efficiently implemented on an integrated circuit.

In a typical broadcast transmission or archival data storage system, each receiver or retriever will require such a decoder, and since these may be marketed and sold as consumer products, it is desirable for the design of the decoder to be as simple, efficient and economical as possible.

Therefore, while the prior art Reed-Solomon decoders have been somewhat satisfactory, an even simpler and efficient Reed-Solomon decoder which employs a more hardware-efficient and yet more general architecture than is found in the prior art for situations where the R-S data block exceeds a certain length, as it does in the GA standard, is desired.

SUMMARY OF THE INVENTION

In the general method of Reed-Solomon decoding, a set of cumulative "sums" of the data in a given R-S block is computed; these are called syndromes and are equal in number to the error-checking bytes in the block. The location and magnitude of every error in the block is determined using only the syndromes, and will be correct for every block in which the number of bytes in error does not exceed half the number of error-checking bytes. With this knowledge, the bytes in error can be located within the block and, as each is identified, the error magnitude can be added to the corrupted data to reproduce the original value. The syndrome computation must be performed for each data block, and may be done as the data is input to the decoder, using standard methods. The final correction must also be performed for the entire block, and once again may be done as the data is output from the decoder, after the error locations and magnitudes have been determined. These computations, however, constitute the most difficult part of the Reed-Solomon decoding process, and typically require complicated hardware to perform.

Therefore, in accordance with the invention, a Reed-Solomon decoder architecture which implements the computations of data error locations and magnitudes, given the syndromes for that block, in a very hardware-efficient manner, is provided. This architecture is shown to perform a broad class of mathematical operations, in what is known as Galois Field (GF) arithmetic, that are required for Reed-Solomon decoding. It is independent of the means of syndrome computation, and may be used with at least two well-known methods of error correction.

In a preferred embodiment, the error computation processor, can compute the error-locator polynomial, the error-evaluator polynomial, and the values of the errors whose location was determined to be in error, utilizing two polynomial storage registers, two element storage registers, one multiplier for performing selected multiplication and division, one adder for performing selected addition and subtraction, one error locator stack, one error value stack, and a syndrome register for storing the syndromes of the large data block.

In particular, the first polynomial storage register may be utilized for storing up to t+1 bytes of the coefficients of the error locator polynomial; the second polynomial storage register may be utilized for storing up to 2t bytes of the coefficients of the error evaluator polynomial and for storing the coefficients of B(x) during the execution of the Berlekamp-Massey algorithm; the first element storage register may be utilized for computation of the discrepancy, for storing the normalized value of the discrepancy, for storing intermediate values during the computation of the individual coefficients of the error evaluator polynomial and for storing the results of the evaluation of the error evaluator polynomial; the second element storage register may be utilized for storing a prior non-zero value of the discrepancy; the error locator stack may be utilized for storing the roots of the error locator polynomial; and the error value stack may be utilized for storing the magnitude of each error and for storing the derivative of the error locator polynomial during a Chien Search.

Accordingly, it is an object of the invention to provide an improved Reed-Solomon decoder that carries out a maximum amount of processing functions with a minimum amount of hardware.

Another object of the present invention is to provide an improved Reed Solomon decoder architecture that can be easily integrated into an integrated circuit.

Another object of the present invention is to provide an improved Reed Solomon decoder that achieves an increase in processing speed.

Still other objects of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWING

For a fuller understanding of the invention, reference is made to the following description, taken in connection with the accompanying drawing, in which:

FIGS. 5A–B depict a known Chien search circuit for polynomial root locations while

DETAILED DESCRIPTION OF THE PREFERRED EMBODIMENTS

Figure 1:
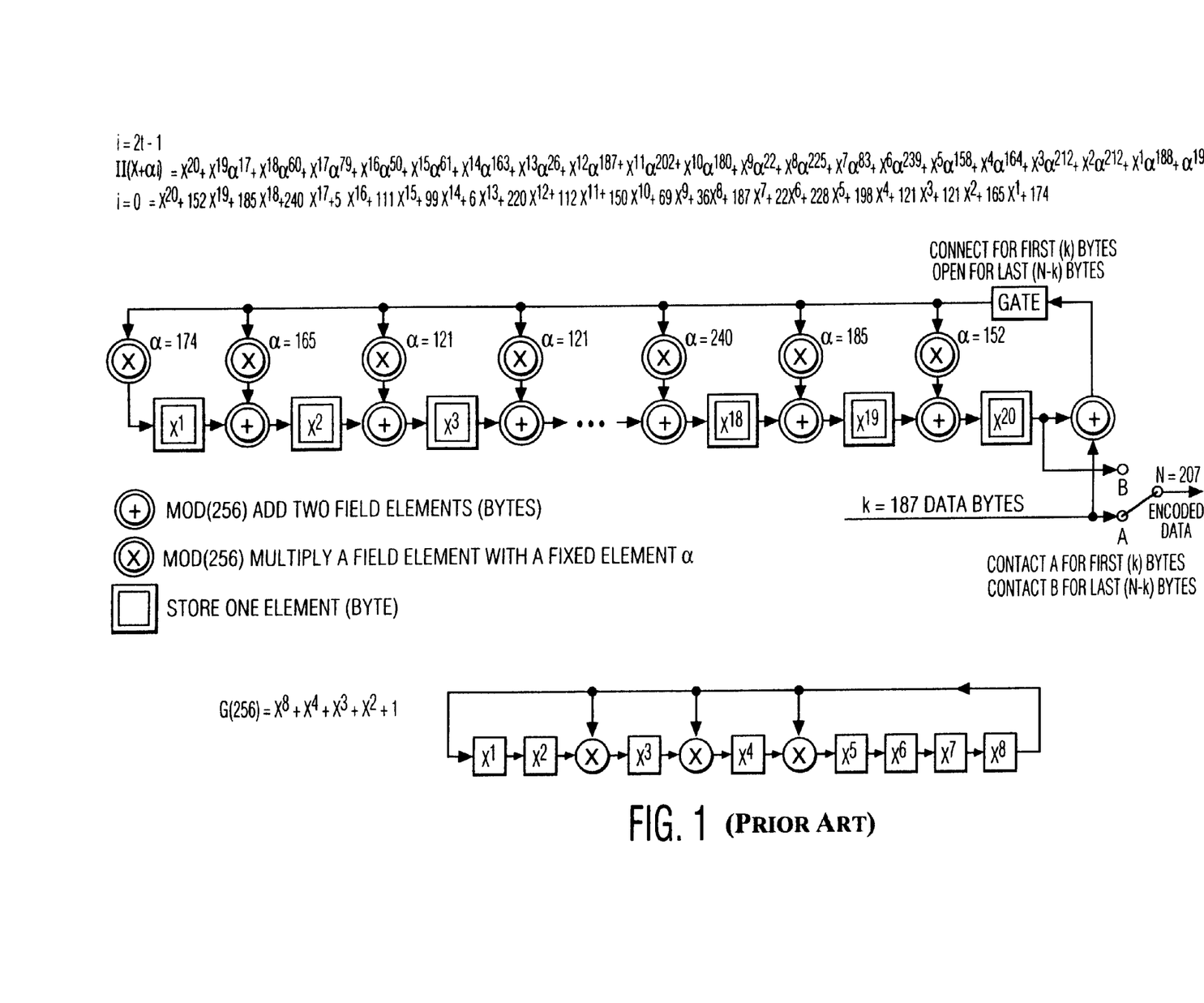
FIG. 1 illustrates the Reed-Solomon code specified in the Grand Alliance (GA) standard.

The Reed-Solomon code specified in the Grand Alliance (GA) standard is shown in FIG. 1. It uses a block length of 207 bytes, 187 of which consist of an MPEG transport packet that constitutes the "payload" data, with the remaining 20 bytes generated by the encoder circuit at the transmitter (not shown). This encoder circuit essentially performs a "division" of the data block, which is treated as a degree-206 polynomial over Galois Field GF(256), by a "generator" polynomial (specified for the given R-S code) to generate a "remainder" polynomial that forms the 20 error-checking bytes at the end of the block. Although the circuit is specific to the R-S code used in the GA standard, it nevertheless illustrates the general structure and operation of a known Reed-Solomon encoder; only the block length, number of check bytes, and generator polynomial will be different.

Figure 2:
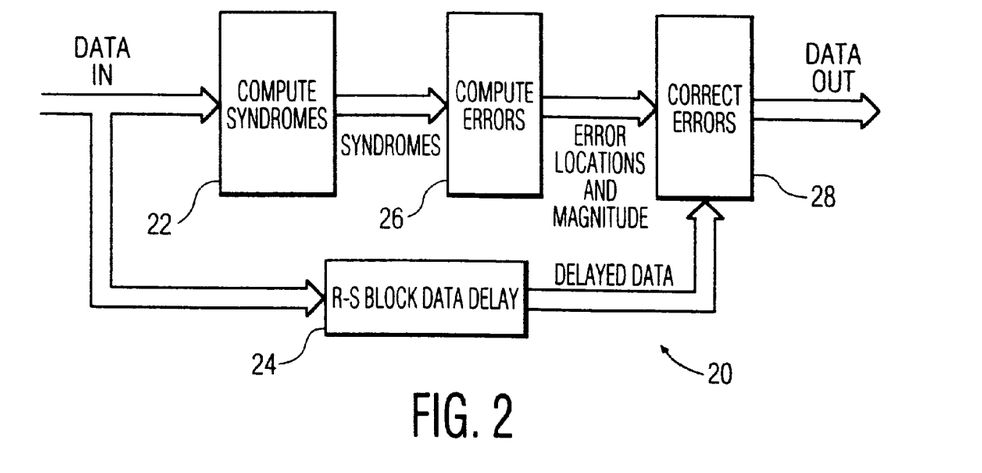
FIG. 2 is a block diagram of a Reed Solomon decoder constructed in accordance with the invention.

Reference is now made to FIG. 2 which depicts a Reed-Solomon decoder generally indicated at 20. As shown in FIG. 2, data entering decoder 20 is input to a syndrome computer 22 and a Reed-Solomon block data delay 24. The resulting computed syndromes are input to an error computer 26 from syndrome computer 22. Error computer 26 determines the error locations and magnitudes as discussed in greater detail below. An error corrector 28 is provided. Error corrector 28 receives as inputs, both the error locations and magnitudes from the error computer 26 and the delayed data from the Reed-Solomon block data delay 24.

The first step in the decoding process is the syndrome computation. This requires processing of the entire R-S block, independently of the size of the block or the number of check bytes. The number of syndromes, however, is equal to the number of check bytes, which in turn increases with the size of the block but becomes a smaller percentage of the block size as this occurs. The resulting syndromes are then used to determine the error locations and magnitudes in the block. A standard, well-known circuit for performing syndrome computation is described in *Error Control Coding,* in chapter 6, which is herein incorporated by reference, and page 174 in particular. A decoder for an R-S code capable of correcting up to t errors (t=10 in the GA standard) will require 2t such circuits, one for each syndrome.

Figure 3:
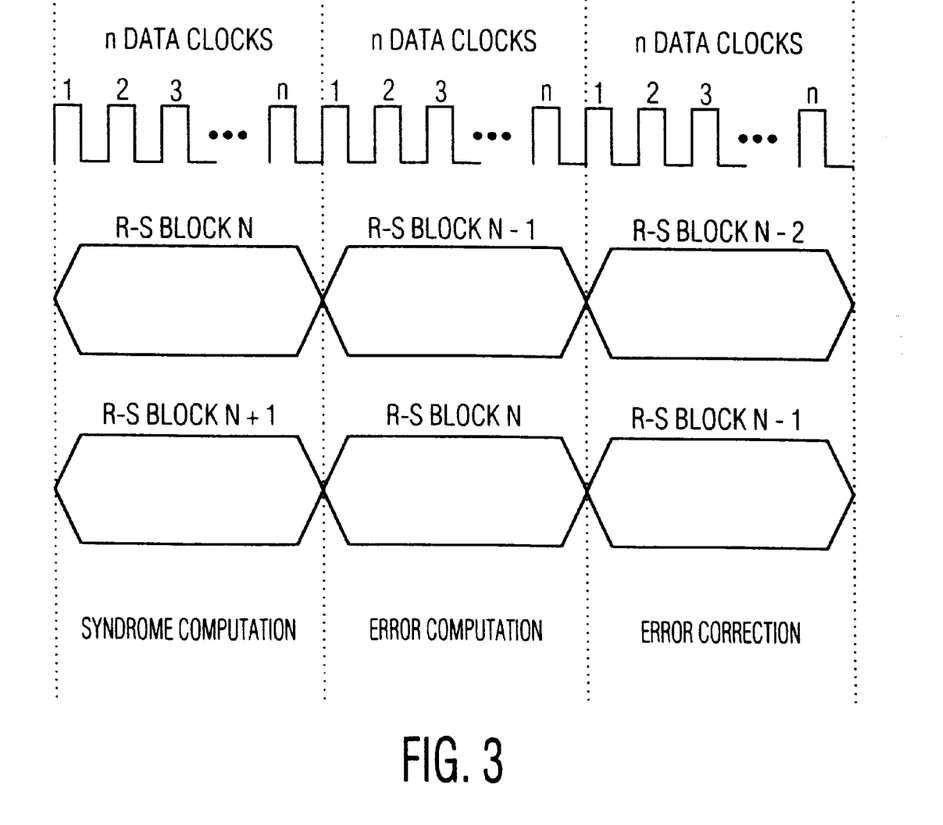
FIG. 3 is a timing diagram for a Reed-Solomon decoder constructed in accordance with the present invention.

The values of the syndromes will not be known until an entire block is input to decoder 20 and the input data must be delayed by Reed-Solomon block data delay 24 by one block interval to account therefor. The error computation is then performed by error computer 26, and the data output from the decoder corrected. The error correction requires a complete block interval. "Pipelined" processing of R-S blocks can be achieved if the error computation is completed in one block interval, and the data once again delayed by a second interval. A system timing diagram for decoder 20 is shown in FIG. 3.

As stated above, error computer 26 determines the error locations and magnitudes by means of computations employing polynomial arithmetic operations over a Galois field appropriate to the data being transmitted (GF(256) in the case of 8-bit bytes). First, an error-locator polynomial must be generated whose roots over GF(256) correspond, respectively, to the location of each detected error within the R-S block. This may be done using any of a number of standard algorithms, of which the Euclidean and the Berlekamp-Massey are the best known. Much of the prior art in high-speed Reed-Solomon decoders use the Euclidean algorithm because it is capable of a more rapid computation of the required polynomial. The Euclidean algorithm has the disadvantage, however, of requiring a greater amount of hardware for implementation. On the other hand, the Berlekamp-Massey algorithm, although not as fast, can be implemented with much less hardware because it requires less arithmetic logic and data storage than that required for the Euclidean algorithm. Consequently, a more efficient design is achieved by utilizing the Berlekamp-Massey algorithm. The architecture to implement the Berlekamp-Massey algorithm will be discussed in greater detail below as will be the means of optimizing the architecture to reduce the execution time of the algorithm.

Associated with the error-locator polynomial is the error-evaluator polynomial, which is computed using the error-locator polynomial and the syndrome values for the R-S block. The two polynomials will subsequently be used to calculate the error magnitudes once the error locations are determined. This is done by finding the roots of the error-locator polynomial (i.e. primitive values in GF(256) which, when substituted for the polynomial variable, give a result of zero), each of which corresponds to the location of an error in the block. The finding of the roots is performed using an exhaustive search method known as the Chien Search, where all possible block location values are substituted in the polynomial to determine which ones yield a result of zero. The roots of the polynomial are then stored as described below, and the well-known Forney Algorithm is used to compute the error magnitude for each root using the error-locator polynomial and the error-evaluator polynomial. All of the above operations, except for the Chien search which requires dedicated hardware, can be performed using the architecture constructed in accordance with the present invention as described in detail below.

A flow-chart for the Berlekamp-Massey algorithm which computes the error-locator polynomial is described in Theory and Practice of Error Control Codes, chapter 7, which is herein incorporated by reference, and page 186 in particular.

Generally speaking, in the Berlekamp-Massey algorithm, the maximum length of the two polynomials $\Lambda(x)$ and $B(x)$ during a given iteration of the algorithm corresponds to the value of the register length parameter L during that iteration, and not necessarily to the maximum length t+1 of the registers. In practical designs, however, polynomial shift registers used to implement this algorithm always have the maximum length. This means that, during any iteration, the number of clock cycles required to perform a polynomial operation will always be t+1 regardless of the actual length of the polynomial in that iteration. Since there are two such operations during each iteration of the algorithm, the result is that 2(t+1) clock cycles will be used when in fact much fewer may be needed. This degrades the speed of decoding significantly if the clock rate is limited by the hardware, or else will require a faster clock to achieve the desired decoding rate.

The polynomial processor 60 can overcome this limitation by using the register length parameter L to set the lengths of the two registers, and then creating a "short circuit" from the input to the output of every register element that stores a coefficient of degree higher than L. Using constant-length registers, the number of clock cycles required for the 2t passes of the algorithm is 4t(t+1); using variable-length registers, however, L never exceeds half the number of the current iteration. The maximum number of cycles for a given pass becomes 2(L+1), and the total number of cycles for the algorithm is now the sum of an arithmetic series and equals 2t(t+3). A reduction in execution time of almost a factor of two is thus achieved. For the GA standard, this equals 260 clock cycles.

The error-evaluator polynomial $\Omega(x)$ is the modulo 2t product of the error-locator polynomial computed above and the syndrome polynomial. The polynomial processor is capable of performing this computation, especially since the error-locator polynomial already resides in one of the two storage registers 61 and 62 as discussed below (see FIG. 4A), and the error-evaluator polynomial can be written into the second register 62 (with length of 2t). Each product coefficient uses every term of the error-locator polynomial, and so requires t+1 clock cycles to compute. The error-evaluator polynomial is thus computed in 2t(t+1) clock cycles, which, for the GA standard, equals 220.

As would be understood by one of ordinary skill in the art, the Berlekamp-Massey algorithm requires two polynomials $\Lambda(x)$ and $B(x)$ ($T(x)$ being utilized for temporary storage and therefore not needed in an actual implementation), and executes for 2t iterations. A shift-register architecture that performs the algorithm found at page 186 of *Theory and Practice of Error Control Codes* is also described therein at page 189. A flow chart of a complete Reed-Solomon decoding process is also described in the aforementioned text at page 190. As stated above, all of which is incorporated by reference.

Figure 4A:
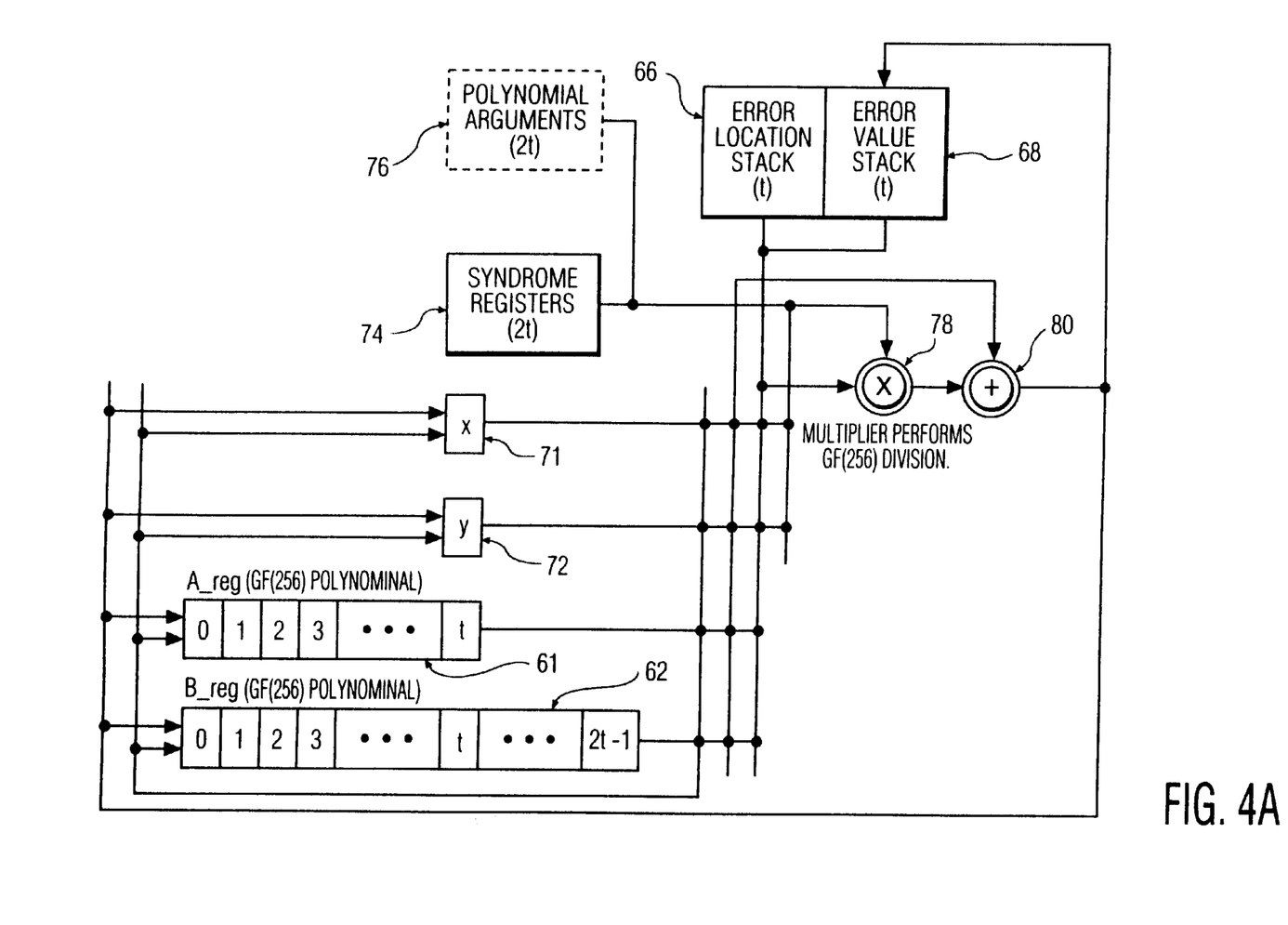
FIG. 4A depicts a Galois Field (GF) polynomial processor constructed in accordance with the present invention.
Figure 4B:
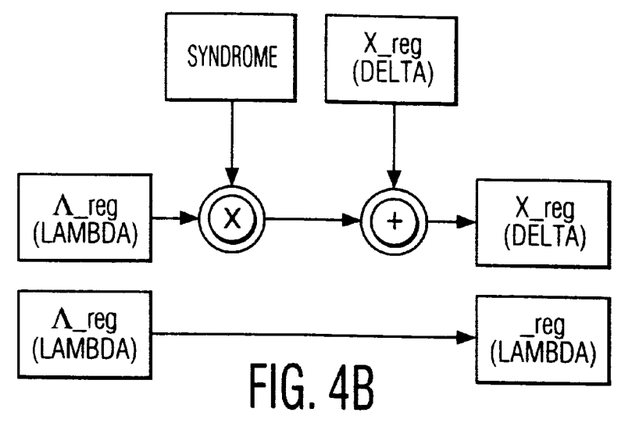
FIG. 4B depicts a configuration of the present invention for the computation of discrepancy ($\Delta$)

Reference is now made to FIG. 4A which depicts an error-computation processor 60 for Reed-Solomon decoding in accordance with the present invention. In the preferred embodiment, processor 60 performs Galois Field arithmetic on polynomials having maximum length t+1 and 2t, respectively. As will be discussed herein and will become quite apparent to the skilled artisan, processor 60, as constructed in accordance with the present invention, is optimized both for minimum hardware and minimum computation time. In particular, processor 60 is designed to store, and to preform mathematical operations on, arithmetic elements of, as well as polynomials over, a Galois Field. Such an element may be represented using standard binary numbers (bits), e.g. an element in GF(256) may be represented using 8 bits, or one byte. A polynomial over a GF may be represented by its coefficients, each of which is in turn an element of the GF; an n-th degree polynomial may therefore be represented by n+1 such elements. In the case of GF(256) using binary representation, this becomes equivalent to n+1 bytes.

This permits elements of the GF to be stored in standard digital data registers, polynomials to be stored in groups of registers, and manipulation of and arithmetic operations on elements and polynomials to be performed using conventional digital logic.

Referring again to FIG. 4A, the 2t syndromes for a Reed-Solomon block are computed in syndrome computer 22 and are deposited in syndrome registers 74. Each of these 2t registers 74 stores one syndrome, which is just a GF element. The GF(256) syndrome registers thus consist of 2t byte registers. If timing gaps between R-S blocks are not allowed, these registers must receive the results of all 2t syndrome computations at the same time; in this case, 2t distinct registers are required. The reason for this, as may be understood from the timing diagram of FIG. 3, is that the syndromes for R-S block n+1 are being computed at the same time that the error computation is being performed for R-S block n, and the syndrome values are not available until their computations have been performed for the entire block (i.e. at the end of the block). Additionally, the syndrome values must be cleared at the beginning of the subsequent block in order to start a new set of syndrome computations. This means that fewer than 2t clock cycles will be available to transfer the syndrome values into their storage registers, and they must therefore be transferred simultaneously, which requires the simultaneous writing of the 2t syndromes into the 2t registers. For error computation, however, it is only necessary to read the contents of one register at a given time. If gaps are permitted in the timing, then, it is possible to transfer the final results of the 2t syndrome computations sequentially during the gap interval, and the syndrome registers may then be implemented using a register file, or even a small memory, having 2t byte locations. The syndrome computations may be performed using any of a number of well-known methods, such as that described in chapter 6 of *Error Control Coding*.

Figure 4C:
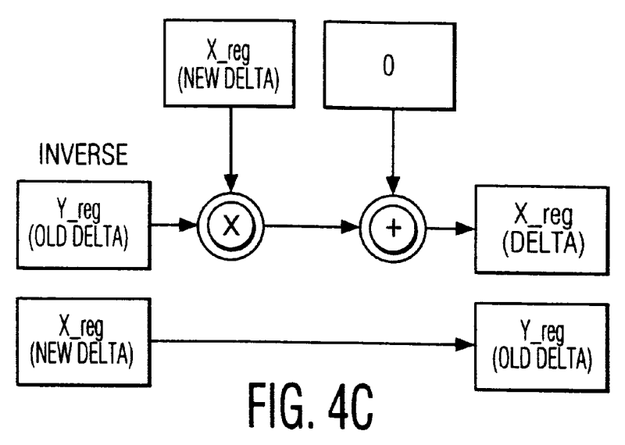
FIG. 4C depicts a configuration of the present invention for the normalization of discrepancy ($\Delta$)
Figure 4D:
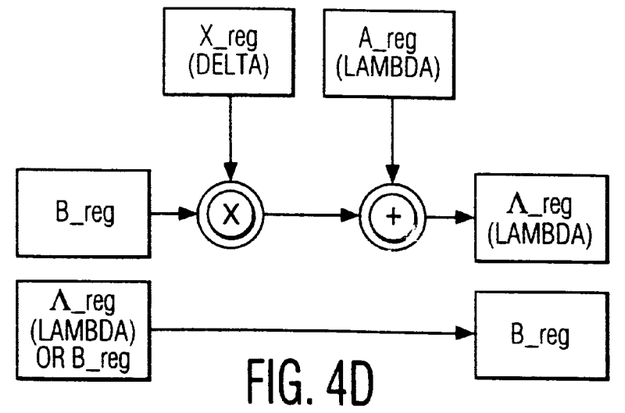
FIG. 4D depicts a configuration of the present invention for the computation of error-locator polynomial $\Lambda(x)$.
Figure 4E:
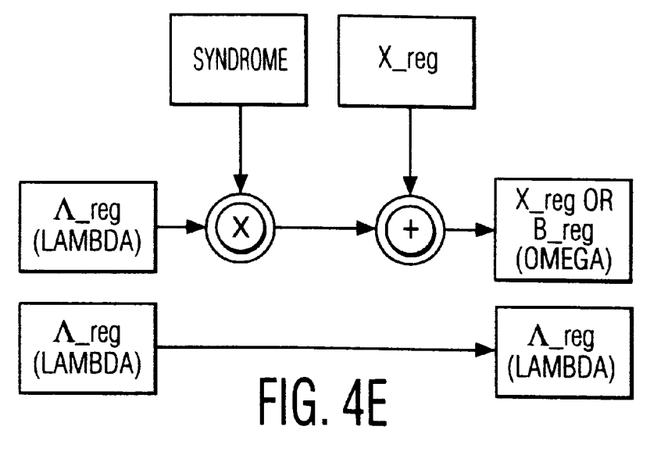
FIG. 4E depicts a configuration of the present invention for the computation of error-evaluator polynomial $\Omega(x)$.
Figure 4F:
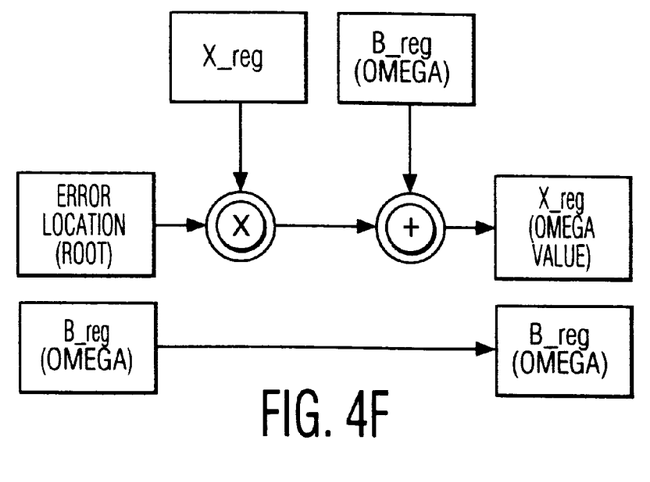
FIG. 4F depicts a configuration of the present invention for the evaluation of error-evaluator polynomial $\Omega(x)$.
Figure 4G:
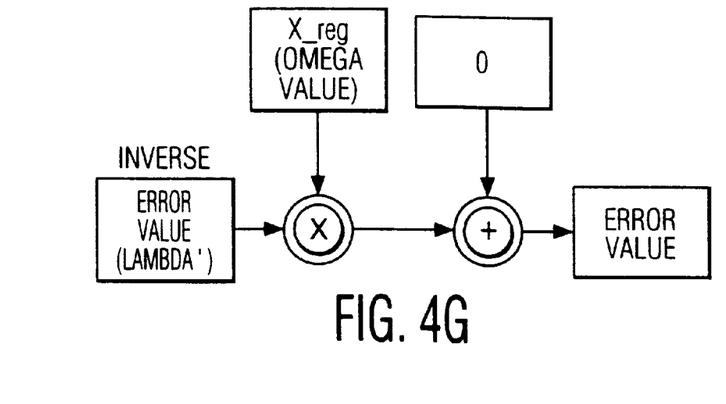
FIG. 4G depicts a configuration of the present invention for the evaluation of magnitudes of the detected errors.
Figure 5A:
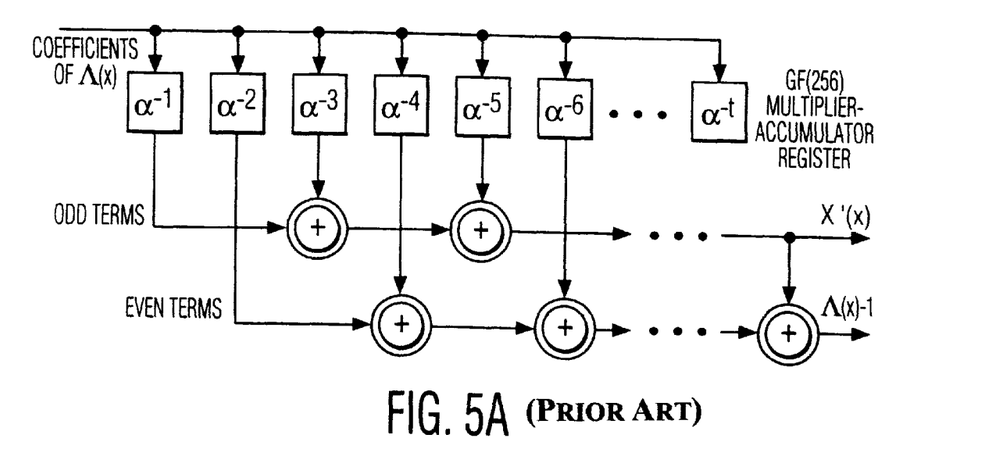
Figure 5B:
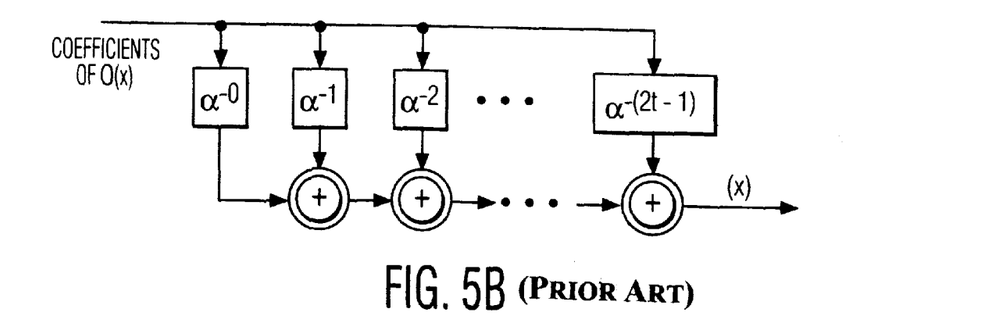
Figure 5C:
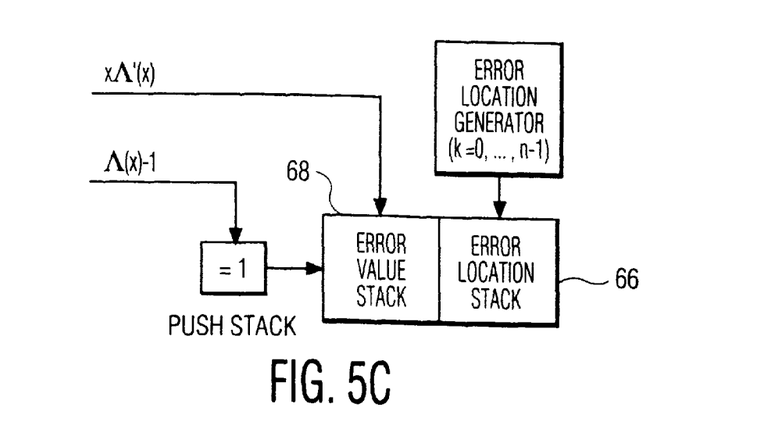
FIG. 5C depicts the interrelationship between the processor constructed in accordance with the present invention and the Chien Search architecture.

The three GF algorithms that are performed by processor 60 are the Berlekamp-Massey (B-M) algorithm for computing the error-locator polynomial, the computation of the error-evaluator polynomial, and the Forney algorithm for computing the error values (the Chien search for computing the error locations is preferably performed by method and construction depicted in FIGS. 5A–C. The sequence in which these algorithms are performed is described at page 190 of *Theory and Practice of Error Control Codes*. The three algorithms all involve arithmetic computations on GF elements and polynomials. Examination of the algorithms shows that only a restricted set of manipulations and arithmetic operations is performed, and that a maximum number of elements and of polynomials need be stored at any given time for any of these three algorithms, thereby achieving the novel and more efficient architectural configuration depicted in FIGS. 4A–G.

As shown in FIG. 4A, processor 60 includes two storage registers 61 and 62 (hereinafter also referred to as registers A and B) for storing GF polynomials, two registers 70 and 72 (hereinafter also referred to as registers X and Y) for storing GF elements, a GF multiplier 78 followed by a GF adder 80, and data busses that allow interconnection of any data source and destination. One feature of this architecture is that there are two complete sets of data busses, which permits two simultaneous data transfers between source and destination to take place; this allows certain algorithms as discussed below to complete execution in less time, i. e. fewer clock cycles.

For the case of GF(256) in which each GF element is represented by an 8-bit binary number, each of the two element registers 70, 72 may be implemented using byte-storage registers. The two polynomial registers 61, 62 may be implemented using multiple-byte storage, with one byte for each coefficient of the stored polynomial.

For an R-S code with an error-correction capability of t byte errors, the minimum polynomial storage requirement for the three algorithms performed by the error-computation processor consists of one polynomial of degree t (requiring t+1 bytes of register storage), and one of degree 2t−1 (requiring 2t bytes of storage). The data busses in the preferred embodiment are 8-bit busses. Multiplier 78 and adder 80 each have two 8-bit data inputs and one 8-bit output, and are implemented using standard combinatorial logic that implements their respective operations in GF(256) arithmetic.

Since GF arithmetic operations (addition, multiplication, and division) and data transfers must be performed on each individual element of a polynomial, whether the final result is an element or another polynomial, a mechanism for rapid successive access to the individual polynomial coefficient byte registers is needed. This is achieved by implementing the polynomial storage registers as shift registers of coefficient bytes, arranged with the highest-order coefficient at the front (output) of the register, and the lowest-order at the rear (input). An operation on a polynomial then requires the coefficients to be "circulated" in the storage register so that a new coefficient is output and/or input to the register (depending on whether the polynomial register is a source or a destination or both) every clock cycle, and after a number of clock cycles equal to the length of the register, the coefficients are in their original positions within the register.

In addition to data transfers between the storage registers, the operations performed on the stored data are multiplication, division, and addition. The first two operations are performed by GF multiplier 78 (it is understood that division is achieved by multiplier 78 which may be used as a divider by simply performing an inversion over the GF on the divisor and performing a multiplication of the result and the dividend). Addition, performed by adder 80, which, for GF(256) or any other GF of interest, consists of a bitwise exclusive-or of the two byte elements that represent the addend and the augend. The configuration of processor 60 allows for, in addition to the above individual operations, the multiplication or division of two elements followed by addition of a third. It is the case that these combinations constitute all of the arithmetic operations on GF elements that are required for any of the three algorithms performed by this architecture.

Reference is now made to FIGS. 4B–4G in combination with the following disclosure, for an understanding how various portions of the forgoing algorithms are calculated.

The Berlekamp-Massey algorithm consists of three separate operations that are performed for each of the 2t iterations of the algorithm. The first of these is the computation of the so-called discrepancy (designated by $\Delta$) (see FIG. 4B), which is determined by the value of the error-locator polynomial (designated by $\Lambda(x)$) at the current iteration (this polynomial constitutes the final result of the algorithm at the last iteration, and is successively "built up" during the course of the B-M algorithm), and of the 2t syndromes. The syndromes are stored in the 2t syndrome storage registers 74, and the coefficients of $\Lambda(x)$ are stored in polynomial storage register 61. The value of $\Delta$, in a given iteration, is formed by generating an accumulated sum of products of individual $\Lambda(x)$ coefficients (stored in register 61) and syndromes (stored in register 74), and is stored in element register 70. Since the value of $\Lambda(x)$ is not modified by this operation, its coefficients are read out of register 61 and then written, or "circulated", back into register 61; this permits all of the individual coefficients to be successively accessed, multiplied by the appropriate syndrome, and added to the accumulated sum whose final value, at the end of circulation, constitutes the desired value of $\Delta$. In this operation, the use of polynomial register circulation technique is used to achieve the desired results. In the preferred method, register 61 is used as both a source and a destination polynomial register, while register 70 is utilized as both a source and destination element register.

The second step that occurs in an iteration of the B-M algorithm, when the above discrepancy $\Delta$ does not equal zero, is its normalization, or division by its previous nonzero value, which is stored in register 72 (see FIG. 4C). The new normalized value is stored in register 70, and the old unnormalized value is now stored in register 72 for use in the subsequent normalization.

The third and final step of the B-M algorithm iteration, which once again occurs only when the discrepancy $\Delta$ is not zero, is the computation of the updated value of the polynomial $\Lambda(x)$ (FIG. 4D), still stored in register 61, based on its current value, the new value of $\Delta$ (stored in register 70), and of an auxiliary polynomial designated B(x), which is stored in register 62. Under certain conditions, the polynomial B(x) is updated to be the current (although not updated) value of $\Lambda(x)$; under other conditions (specified in the Berlekamp-Massey algorithm) it is not updated and re-circulated in register 62. In either case, the two polynomials are circulated in their respective registers (61 and 62), and each individual coefficient is read and written in one clock cycle. The computation of the updated $\Lambda(x)$ consists of multiplying each coefficient of auxiliary polynomial B(x) (in register 62) by the normalized $\Delta$ (in register 70), and adding the corresponding (i.e. to the same power of x) coefficient of the current $\Lambda(x)$ (in register 61). This is done for every coefficient of $\Lambda(x)$, and the resulting updated coefficients are circulated back into register 61.

Referring to FIG. 4E, computation of the error-evaluator polynomial $\Omega(x)$ is performed using the error-locator polynomial $\Lambda(x)$ previously computed by the B-M algorithm, which still resides in register 61, and the 2t syndromes, which still reside in the syndrome registers 74. As with the previous polynomial, the error-evaluator is successively "built up" over the course of 2t iterations, with each coefficient of $\Lambda(x)$ consisting of an accumulated sum of the products of selected coefficients of $\Lambda(x)$ with selected syndromes. The final result is a polynomial of order 2t−1, having 2t coefficients, which is stored in register 62. At this point, register 61 (consisting of t+1 element registers) stores the error-locator polynomial $\Lambda(x)$, and register 62 (consisting of 2t element registers) stores the error-evaluator polynomial $\Omega(x)$.

Determination of the actual locations of data errors in an R-S block is performed by finding the roots of the error-locator polynomial $\Lambda(x)$, each of which directly corresponds to an error location. This is not performed by error-computation processor 60, but is instead performed by the Chien search, which evaluates the polynomial $\Lambda(x)$ at all possible data location values for the R-S block, so that all which yield a result of zero (i. e. roots of the polynomial) correspond to block errors and are stored, or "pushed", on the error-location stack 66. Once again, the roots are GF elements, which, in GF(256), are represented as data bytes. Since the R-S code is capable of correcting at most t errors, the error-location stack has a depth of t and a width of 8 bits (1 byte).

Generally speaking, The Chien search for the roots of the error-locator polynomial consists of its evaluation for n values, where n equals the length of the R-S block (207 in the GA standard). This means that each evaluation must be performed very rapidly, hence the polynomial processor cannot be used as it would require t+1 clock cycles per value using Horner's rule as discussed below; hardware is needed to do each evaluation in one cycle, so that the search can be completed in n cycles. The circuit, shown in detail in FIGS. 5A–B, consists of a set of registers in which the coefficients of the error-locator polynomial are loaded for initialization, and, in each successive clock cycle, the i'th coefficient register contents are multiplied by the i'th power of GF(256) primitive $\alpha$. Details of the Chien search can also be found at pages 159–160 of *Error Control Coding*. The GF(256) sum of all t registers is then generated to determine whether a root has been found. In this event, the root is pushed on top of the stack memory for subsequent use. Computation of the error-evaluator polynomial does not use these roots, and can therefore be performed concurrently with the Chien search after completion of the Berlekamp-Massey algorithm. For the GA standard, the respective number of clock cycles required is nearly equal (220 vs. 207). If the number of roots found does not equal the degree of the polynomial, an uncorrectable error condition exists. This means that number of errors in the block exceeded t, and the block cannot be corrected. The presence of such a condition indicates that the block is not valid. The error location stack 66 is required because the search is initiated with a GF element that corresponds to the last location in the R-S block; consequently, if the block data is to be processed (and corrected) in first-to-last order, it is necessary to reverse the order of the polynomial roots relative to that in which they were evaluated during the search.

The final algorithm to be performed is the Forney algorithm, which uses the first derivative (in the GF sense) of the error-locator polynomial, as well as the error-evaluator polynomial, both evaluated at each error-locator root that was found by the Chien search and stored in error-location stack 66.

Again, generally speaking, the Forney algorithm, which is used to compute the error magnitudes given the above roots and the two polynomials, is given by the formula described at page 190 of *Theory and Practice of Error Control Codes*. $\Omega(x)$ must be evaluated for each root x found during the Chien search. In GF(256) arithmetic, however, the derivative of $\Lambda(x)$ is found by taking the sum of the odd-power terms of the polynomial evaluated at x and dividing it by x. Since every term of $\Lambda(x)$ is evaluated during the search, it is a very simple matter to generate the sum of only the odd-power terms and store it concurrently with the root, whenever one is found, in a second stack memory. This eliminates the time needed to evaluate the derivative, and because this second stack will be needed for subsequent storage of the error magnitudes, requires little additional hardware and no additional storage. For each root in the stack, whose pointer is reset at the beginning of the algorithm, $\Omega(x)$ is evaluated using Horner's rule as described below, which requires 2t clock cycles, and $x\Lambda'(x)$ is retrieved from the second stack memory for the required division, which requires one cycle. In the general case, division by a power of the root is required, but, in the GA standard, this power is one, thus eliminating the division of $x\Lambda'(x)$ by x which was not previously performed. The result is that this algorithm, which commences when both the Chien search and error-evaluator polynomial computation have completed, requires t(2t+1) clock cycles in the worst case of t roots, which equal 210 for the GA standard. The first derivative of a polynomial over a GF is the sum of the odd terms of that polynomial. Since the Chien search needs to evaluate all polynomial terms, odd and even, the desired odd terms for every location root are selected from the complete polynomial for that root, and their sum is computed (as was that of all terms in order to find the root) and pushed onto the aforementioned second stack 68, called the error-value stack, that also has a depth of t locations. Both the location roots and their associated polynomial derivatives are now stored in the two stacks, and will be used to compute the actual values of the errors corresponding to each location.

Reference is now made to FIG. 4F which depicts the configuration for the evaluation of the error-evaluator polynomial $\Omega(x)$ at each of the values found by the Chien Search. This evaluation is performed by error-computation processor 60 using the polynomial coefficients that were stored in register 62 and the location roots that were stored in the error-location stack 66. This is done for each root by successively multiplying the accumulated product stored in register 70 by the root value stored in the stack, adding the result to the current polynomial coefficient stored in register 62, and storing the resulting new accumulated product back in register 70. This is repeated for al 2t coefficients of $\Omega(x)$, and the final result of the last iteration is the value of $\Omega(x)$ evaluated for the location root and is stored in register 70. This algorithm for polynomial evaluation is known as Horner's rule.

Reference will now be made in particular to FIG. 4G for a discussion of the evaluation of the error magnitude. In particular, the Forney algorithm requires that the above value of $\Omega(x)$ for a given root be divided by the derivative of $\Lambda(x)$ evaluated at the same root. The derivative of $\Lambda(x)$, however, was obtained as a by-product of the Chien search, and stored in the error-value stack 68 alongside the root. Consequently, the values of both polynomials, evaluated at the root, are now readily available, and may be divided by the GF multiplier/divider 78 to obtain the desired error value. This result is now stored in the error-value stack 66 alongside the root value, replacing the first derivative of $\Lambda(x)$. This procedure, including the evaluation of the $\Omega(x)$ polynomial by Horner's rule, is repeated for every root of Λ(x) that was discovered by the Chien search. The two stacks then contain the t error values and their locations, both of which are needed by error corrector 28 to perform the actual error correction.

Figure 6:
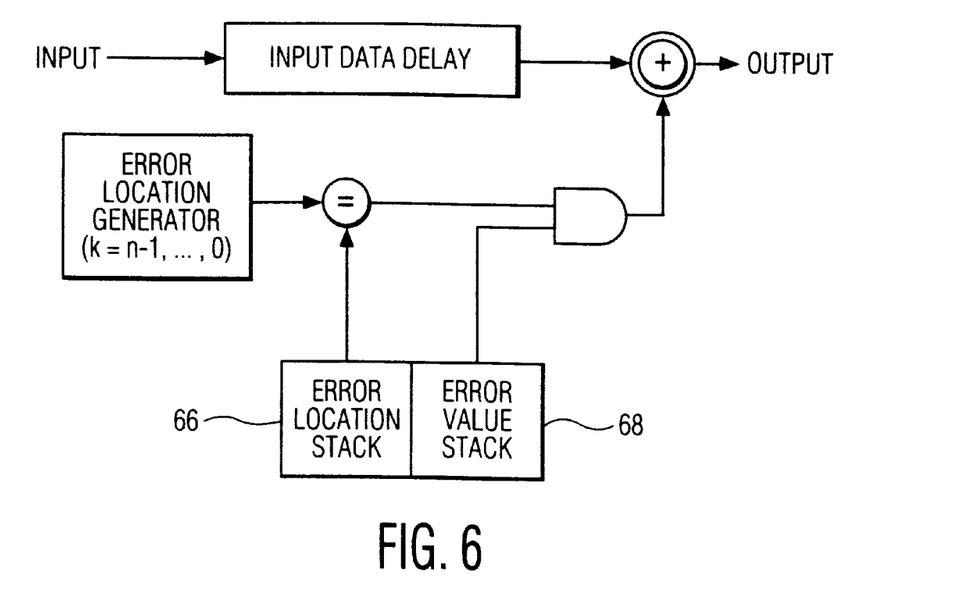
FIG. 6 depicts a block diagram of a correction circuit used in combination with the present invention.

The actual error correction, which takes place after all error locations and magnitudes have been determined, is performed by a circuit such as that shown in FIG. 6. It delays the input R-S block data by two block intervals as described earlier, and uses the errors and magnitudes found in the error computation section and stored in the two stack memories to perform the corrections. When the Chien search was performed, initialization of the Chien search required that it be performed in reverse order of block locations relative to that in which the data arrived. Therefore, stack memories were used to store the error information, and that stacks are required for the storage of both error locations and values in both the error computation and the error correction sections of the R-S decoder (data must be "pushed" onto the stacks in the error computation steps and "popped" from the stacks in the error-correction steps). When the respective sections have completed their operation on an R-S block, the results of the error computation must immediately be transferred to the error correction section. Since the error correction section no longer needs the error stack contents when it has finished correcting the entire block, the two sections can exchange their respective error location and value stacks in a "ping-pong" fashion, so that the error corrector 28 receives the results of the most recent error computation and can then begin to correct a new block, and error computation processor 60 in turn receives discarded error data that may be cleared to make room for new data.

The GF elements that correspond to each R-S block data location starting with the first location in the data block are generated by a counter that is initialized to the value that corresponds to the beginning of the block, and counts through all of the block locations in the correct (i. e. not reverse) order. This is done by comparing each location value with the contents of the top of the error location stack 66. When the two values are equal, the lambda(x) root at the top of the stack corresponds to the current data byte location in the R-S block. The contents of the top of the data value stack are then added to the data byte in this block location, and in GF(256) arithmetic this consists of a bitwise exclusive-or of the 8 bits of the error value with those of the data byte. The two stacks are then popped so that the next error location and value pair is on the top, and the procedure is repeated. This is done for every error location and value pair stored in the stacks until the stacks are empty, at which point all detected errors in the R-S block will have been corrected.

Lastly, it should be understood that the foregoing disclosure is not exhaustive and that variations and modifications to processor 60 can be made while staying within the scope of the invention. For example, the lengths of the polynomial storage registers have been described as having a length of t+1 for both Λ(x) and the auxiliary polynomial B(x), and a length of 2t for Ω(x). This means that polynomial storage register 61, which stores Λ(x), consists of t+1 element registers for the t+1 coefficients of Λ(x). Register 62, however, has a length of t+1 element registers when used to store auxiliary polynomial B(x), but requires 2t elements to store Ω(x); it must thus have the capability of being configured for either length; this can be accomplished by using a multiplexer, which selects the element register that corresponds to the coefficient having the polynomial order of the desired length.

The ability to modify the length of a polynomial storage register is needed in order to eliminate the need for a third register (i. e. two of length t+1 for Λ(x) and B(x), and a third for Ω(x)), and for the possibility of configuring a polynomial storage register to any desired length. This would be of use in the B-M algorithm, which specifies register length as a parameter that changes during the course of the algorithm. Although this is generally used in practice for software implementations of R-S decoders, as it permits the algorithm to complete in fewer machine cycles, known hardware implementations use fixed-length shift registers.

The use of such a generalized method of polynomial storage register length modification in the error-computation processor architecture of FIG. 4A, which has already been optimized both for minimum hardware and for maximum data-transfer capability (i. e. any two desired data transfers are able to take place simultaneously), will allow the required error computations to be performed in even fewer clock cycles than previously described. The reason for this is that any operation that involves a polynomial requires circulation of the complete polynomial through its register, and this will consist of either t+1 or 2t coefficients, even when the actual polynomial length is much less than t+1 or 2t, respectively, and many of these coefficients are therefore zero; this means that the same number (t+1 or 2t) of clock cycles is needed for every polynomial operation, regardless of the actual length of the polynomial.

Figure 4H:
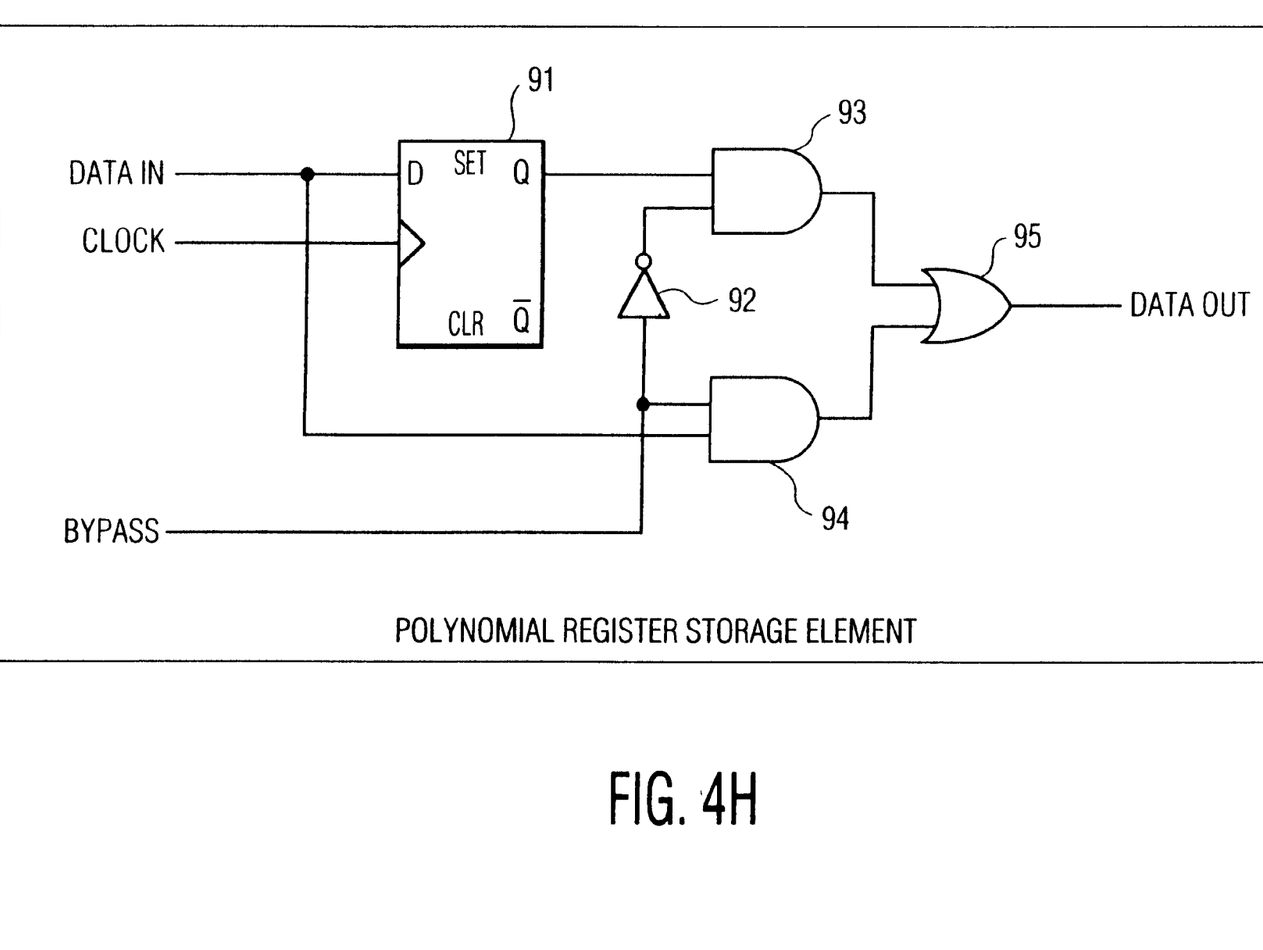
FIG. 4H depicts a polynomial register storage element (i.e. one (1) bit) constructed in accordance with the present invention.

Reference is now made to FIG. 4H which shows a preferred polynomial register storage element that, because of its unique circuit arrangement, permits for the adjustment of the polynomial storage register length. In particular, the circuit preferably includes, a flip-flop 91 and a multiplexor including an inverter 92, two AND gates 93, 94 and an OR gate 95. This configuration allows any storage element in the polynomial register to be effectively "short circuited", thereby reducing the effective length of the register. As the execution of the B-M algorithm proceeds, fewer of these elements are "short-circuited", and the polynomial register is thereby "grown" in length as the register length parameter of the B-M algorithm increases in value. Control of the register length is performed by the control circuit (not shown) of error-computation processor 60, which implements all control functions of the storage registers, arithmetic units (multiplier/divider and adder), and data paths that must be performed in order to implement the various algorithms. For the B-M algorithm, the ability to modify the polynomial storage register lengths results in a reduction in the required number of clock cycles of almost one-half. It also reduces the number of clock cycles required to compute the error-evaluator polynomial Ω(x) by about one-third. A penalty that may be paid for this capability, however, is that, due to the additional complexity of and propagation delays in the data paths, the maximum clock frequency at which the processor can be operated may be reduced.

Figure 7:
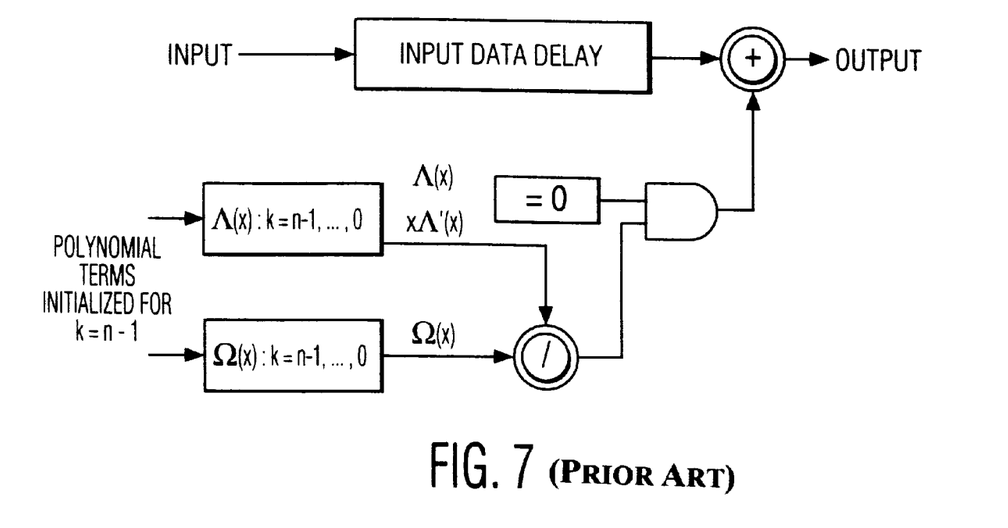
FIG. 7 depicts a known correction circuit in which errors are computed at the output.

An alternative method of performing the error correction that is used is shown in FIG. 7. In this scheme, the error computation consists only of computing the error-locator and error-evaluator polynomials using either the B-M algorithm or some other means (such as the Euclidean algorithm), and the Chien search is performed during the actual error correction using hardware similar to that shown in FIGS. 5A–5B. Once again, this circuit can be used to evaluate both Λ(x) and its derivative x Λ' (x) simultaneously. A similar circuit consisting of 2t−1 registers and GF constant multipliers is used to evaluate Ω(x) concurrently. When a root of Λ(x) is found, the values of x Λ' (x) and Ω(x) that correspond to the root are input to a GF divider which implements the Forney algorithm and outputs the error magnitude. This magnitude is then added to the data byte in error, in the same manner as described above, to perform the correction. One major drawback of this technique is that, since the Chien search must be initialized with the value of the last R-S block location, the search and evaluations are performed in reverse block order. This requires a reversal of the R-S block for the correction to be performed, as well as a second reversal afterwards if subsequent data processing requires the block to be in its original order.

The method of FIG. 7 has the advantage, however, of performing all error computations subsequent to the generation of the error locator and evaluator polynomials during the error correction phase and therefore in real time. This means that the error computation phase can be performed in less time (i. e. fewer clock cycles), since the evaluation of the error-evaluator polynomial and the Forney algorithm are no longer performed in the error computation section.

Processor 60 can be used to compute both of the required polynomials, in the manner described above, once again using a minimum of hardware and clock cycles. Because of the ability of this architecture to perform a wide range of GF operations, however, it can also be used to evaluate all of the individual terms of both polynomials for the R-S block location value that corresponds to the beginning of the block, the Chien search can be started at this location and be performed in the actual block order with no reversal required. Computation of the polynomial terms consists of GF multiplication of each coefficient by the corresponding power of the polynomial variable, which in this case corresponds to the first location of the R-S block. Since the size of the block is fixed, the first 2t powers of this first location value may be computed during the design of the decoder, and stored as the polynomial arguments in storage 76 (FIG. 4A). These values are preferably "hard-wired", and can thus be stored in a small (2t byte) read-only memory. As above, the polynomial coefficients are stored in their respective storage registers (61 and 62), so that the t+1 terms of the $\Lambda(x)$ polynomial and the 2t terms of the $\Omega(x)$ polynomial may be computed by multiplying each coefficient with the corresponding polynomial argument in storage 76. For these two polynomials, this requires 3t−1 clock cycles, which is far less than the t(2t+1) error computation clock cycles eliminated by using this method. The resulting polynomial terms are then used to initialize the Chien search and evaluation, which in this arrangement performs both the actual search for and the correction of errors simultaneously as described above. This initialization is performed by transferring the initial polynomial terms to the Chien search/ error correction hardware of FIG. 7.

Use of the polynomial processor architecture in the error computation section provides a means of eliminating the need for R-S block reversal, particularly in the case of a decoder designed for one specific R-S code (such as the GA standard). It also serves to illustrate the flexibility and generality of this architecture.

The advantage of this method is that, since the Forney algorithm is not performed as part of the error computation, fewer clock cycles are needed; this can be of value in cases where the R-S block is not very large, as well as when timing gaps are not allowed between R-S blocks. A disadvantage is that it requires additional hardware for the rapid evaluation of the $\Omega(x)$ polynomial and for the initialization of both $\Lambda(x)$ and $\Omega(x)$, in addition to a second GF divider for the Forney algorithm. It is therefore of value only in limited circumstances, but in some cases the improvement in performance may be sufficient to justify the additional hardware.

This invention lends itself to efficient implementation on an integrated circuit, and may represent an advancement in the state of Reed-Solomon decoder art for the case of large data blocks.

We claim:

1. An error computation processor for use in a Reed Solomon decoder for computing the error locations and magnitudes of a large data block having a maximum of t errors over a desired Galois field, the processor comprising:

first computing means for computing an error-locator polynomial and an error-evaluator polynomial; and second computing means for computing the values of the errors whose location was determined to be in error;

wherein said first and second computing means requires only a first polynomial storage register, a second polynomial storage register, a first element storage register, a second element storage register, one multiplier for performing selected multiplication and division, one adder for performing selected addition and subtraction, an error location stack, an error value stack, and a syndrome register for storing the syndromes of the large data block.

2. The processor as claimed in claim 1, wherein said second polynomial storage register stores the coefficients of B(x) during the execution of the Berlekamp-Massey algorithm.

3. The processor as claimed in claim 1, wherein said first storage element register stores the normalized value of the discrepancy.

4. The processor as claimed in claim 1, wherein said first storage element register stores intermediate values during the computation of the individual coefficients of the error evaluator polynomial.

5. The processor as claimed in claim 4, wherein said first storage element register stores the results of the evaluation of the error evaluator polynomial.

6. The processor as claimed in claim 1, wherein the error-value stack stores the derivative of the error locator polynomial during a Chien Search.

7. The processor as claimed in claim 1, wherein the multiplier includes an inverter for performing said selected division.

8. The processor as claimed in claim 1, and including a polynomial argument register for storing the initial values of the first t powers of the last location of the data block in a Galois Field (256).

9. The processor as claimed in claim 1, wherein said first and/or said second polynomial storage register comprises a plurality of polynomial register storage elements each of which include a flip flop in series with a multiplexor, whereby the length of the polynomial register can be adjusted.

10. The processor as claimed in claim 9, wherein said multiplexor comprises an inverter, two AND gates and an OR gate.

11. The processor as claimed in claim 1, and including polynomial argument storage means for storing precomputed GF elements; and wherein said multiplier multiplies the precomputed GF elements by the appropriate polynomial coefficients of the error locator polynomial and error evaluator polynomial so as to provide initial values of the polynomials without the need to perform a reversal on the Reed-Solomon block.

12. The processor as claimed in claim 1, and including means for permitting up to two (2) simultaneous data transfers between source and destination registers.

13. The error computation processor as claimed in claim 1, wherein said first polynomial storage register stores up to t+1 bytes of the coefficients of the error locator polynomial, said second polynomial storage register stores up to 2t bytes of the coefficients of the error evaluator polynomial, said first element storage register for the computation of the discrepancy, said second element storage register for storing a prior non-zero value of the discrepancy, said error locator stack stores the roots of the error locator polynomial, and said error value stack stores the magnitude of each error.

14. An error computation processor for use in a Reed Solomon decoder for computing the error locations and magnitudes of a large data block having a maximum of t errors over a desired Galois field, the processor comprising:

first computing means for computing an error-locator polynomial and an error-evaluator polynomial; and second computing means for computing the values of the errors whose location was determined to be in error;

wherein said first and second computing means includes a first polynomial storage register for storing up to t+1 bytes of the coefficients of the error locator polynomial;

a second polynomial storage register for storing up to 2t bytes of the coefficients of the error evaluator polynomial and for storing the coefficients of B(x) during the execution of the Berlekamp-Massey algorithm;

a first element storage register for computation of the discrepancy, for storing the normalized value of the discrepancy, for storing intermediate values during the computation of the individual coefficients of the error evaluator polynomial and for storing the results of the evaluation of the error evaluator polynomial;

a second element storage register for storing a prior non-zero value of the discrepancy;

a multiplier for performing selected multiplication and division;

one adder for performing selected addition and subtraction;

an error locator stack for storing the roots of the error locator polynomial;

an error value stack for storing the magnitude of each error and for storing the derivative of the error locator polynomial during a Chien Search;

and a syndrome register for storing the syndromes of the large data block.

15. The processor as claimed in claim 14, wherein the multiplier includes an inverter for performing said selected division.

16. The processor as claimed in claim 14, and including a polynomial argument register for storing the initial values of the first t powers of the last location of the data block in a Galois Field (256).

17. The processor as claimed in claim 14, wherein said first and/or said second polynomial storage register comprises a plurality of polynomial register storage elements each of which include a flip flop in series with a multiplexor, whereby the length of the polynomial register can be adjusted.

18. The processor as claimed in claim 14, and including polynomial argument storage means for storing precomputed GF elements; and wherein said multiplier multiplies the precomputed GF elements by the appropriate polynomial coefficients of the error locator polynomial and error evaluator polynomial so as to provide initial values of the polynomials without the need to perform a reversal on the Reed-Solomon block.

19. The processor as claimed in claim 14, and including means for permitting up to two (2) simultaneous data transfers between source and destination registers.

20. A Reed Solomon decoder comprising:

syndrome computing means for receiving a large data block having a maximum of t errors and computing the syndromes of said large data block;

an error computation processor for computing the error locations and magnitudes of said large data block, the processor including first computing means for computing an error-locator polynomial and an error-evaluator polynomial; and second computing means for computing the values of the errors whose location was determined to be in error; wherein said first and second computing means includes a first polynomial storage register for storing up to t+1 bytes of the coefficients of the error locator polynomial; a second polynomial storage register for storing up to 2t bytes of the coefficients of the error evaluator polynomial; a first element storage register for computation of the discrepancy; a second element storage register for storing a prior non-zero value of the discrepancy; one multiplier for performing selected multiplication and division; one adder for performing selected addition and subtraction; an error locator stack for storing the roots of the error locator polynomial; an error value stack for storing the magnitude of each error; and a syndrome register for storing the syndromes computed by said syndrome computing means;

error correcting means for correcting said errors in said large data block; and a data delay for delaying the transmission of said data block to said error correcting means.

* * * * *